United States Patent [19]

DeShazo, Jr.

[11] Patent Number: 4,779,161

[45] Date of Patent: Oct. 18, 1988

[54] MULTI-DRIVER INTEGRATED CIRCUIT

[75] Inventor: Thomas R. DeShazo, Jr., Township of Kingwood, County of Hunterdon, N.J.

[73] Assignee: GE Company, Fairfield, Conn.

[21] Appl. No.: 820,808

[22] Filed: Jan. 22, 1986

[51] Int. Cl.⁴ .............................................. H02H 5/04
[52] U.S. Cl. .................................... 361/106; 307/310; 330/207 P; 330/256; 330/298; 361/103
[58] Field of Search ................ 361/103, 106; 307/310; 330/207 P, 298, 256

[56] References Cited

U.S. PATENT DOCUMENTS

4,553,048 11/1985 Bynum et al. ........................ 307/310
4,667,265 5/1987 Stanojeuic et al. .................. 361/103

Primary Examiner—A. D. Pellinen
Assistant Examiner—Jeffrey A. Gaffin
Attorney, Agent, or Firm—S. C. Corwin; H. I. Schanzer; B. E. Morris

[57] ABSTRACT

A monolithic integrated circuit (IC) chip in which is formed a multi-driver power circuit, with each driver circuit including one output power transistor, is partitioned such that the power transistor of each driver circuit, formed in the IC, is spaced apart from those of any other driver circuit a distance sufficiently large to ensure the generation of a temperature differential between the power transistors of the different driver circuits when their power dissipation is different. A thermal sensor is formed in close proximity to each output power transistor, and as far away as possible from the other power transistors of the IC, whereby each thermal sensor is thermally, tightly, coupled to its associated power transistor. Each thermal sensor is electrically coupled to the base of its associated power transistor for controlling the conductivity of its associated power transistor when the power dissipation of its associated power transistor and its resulting temperature exceeds a predetermined level.

7 Claims, 5 Drawing Sheets

MULTI-DRIVER INTEGRATED CIRCUIT

This invention relates to a multi-driver power transistor circuit formed on a monolithic integrated circuit (IC).

A known multi-driver power transistor circuit includes, for example, four power transistors and their associated control components formed on the same IC (or chip). In a typical application, each one of the power transistors is connected to a different, off-chip, load and is designed to drive its load independently of the other power transistors. To prevent damage to the chip in the event of excessive on-chip power dissipation, a thermal sensor is located on the chip. When the power dissipated in the output transistors causes the chip temperature to rise above a preset level, the thermal sensor limits the current through the power transistors thereby limiting the power dissipation on the chip.

A problem with the known circuit is best explained by means of the following typical example.

Assume that each one of the four power transistors of the IC is connected to a different one of the four fuel injection solenoids of a four cylinder automobile engine. Each power transistor is then connected via the inductive winding of its corresponding solenoid to the 12 volt battery of the automobile. Assume further that each power transistor is a bipolar device of N conductivity type, having a collector-to-emitter saturation voltage ($V_{CESAT}$) of 0.25 volt. When the system is operating correctly, each power transistor is driven into saturation and can draw a maximum load (collector-to-emitter) current of 1 ampere through the load. The on-chip power dissipation across each power transistor is then a maximum of 0.25 watts, and the total on-chip dissipation for the four power transistors is then a maximum of 1 watt. Assuming that the thermal resistance between the surface of the chip (where the components are formed) and the ambient is 60° C./watt, and that the ambient is at 25° C., the IC surface (and the junctions of the transistors formed thereat) is then at a temperature of 85° C. when 1 watt is dissipated on the chip.

Assume now that a fault occurs and that the load connected to one of the power transistors is shorted, while the base current to that power transistor remains the same. The collector current through the transistor tends to rise to a value equal to its forward current gain ($\beta$) times its base current. The power transistor then sees 12 volts across its collector-to-emitter while conducting a current which may equal, or exceed, 1 ampere. The power dissipation across the transistor then equals, or exceeds, 12 watts and the transistor's junction temperature rises dramatically, tending to destroy (melt) that power transistor.

However, the thermal sensor located on the chip is coupled to the bases of all the power transistors on the chip to either decrease or remove the base current into the four power transistors and hence diminish or turn-off their collector (load) currents, when the chip temperature exceeds a prescribed value. The thermal sensor thus functions to maintain (or decrease) the dissipation on the chip below a preset level.

The problem with this protection scheme is that although it protects the chip from being destroyed, due to a momentary power surge, it indiscriminately turns-off all the power transistors on the chip. Where the four power transistors, for example, control the four fuel injection solenoids of a four cylinder automobile engine, turning-off the four power transistors shuts down the engine. Thus, although only one cylinder is faulty, the whole system is disabled. This is undesirable since a malfunction of one cylinder causes the whole automobile to be disabled and rendered useless. It is evident that, in the event of a malfunction, the turn-off of the power transistors and the shut-down of the system should be limited and/or localized to the one malfunctioning or non-functioning circuit.

In prior art multi-driver power circuits, it was believed that independent thermal control of the various power transistors was not feasible because, among other reasons, an insufficient temperature gradient existed between the power transistors formed on the same chip.

Applicant recognized that a plurality of separate power drivers could be formed on, or within, a monolithic integrated circuit, and that, given some minimum physical separation between the power transistors, a sufficient temperature differential could be generated permitting the temperature of each power transistor to be sensed and the power dissipation of each power transistor to be separately and individually controlled.

Accordingly, in a monolithic IC multi-driver circuit embodying the invention, where each driver circuit includes an output power transistor, the circuitry formed on the IC is partitioned such that the output power transistor of each driver is spaced apart from the output power transistors of the other drivers to ensure that a temperature differential exists between the output power transistors when their power dissipation is different. A thermal sensing means is formed in close proximity to each output power transistor for sensing its temperature and for controlling its power dissipation, substantially, independently of the temperature of the other output power transistors on, or in, the IC>

In the accompanying drawing, like reference characters denote like components.

Figure 1:
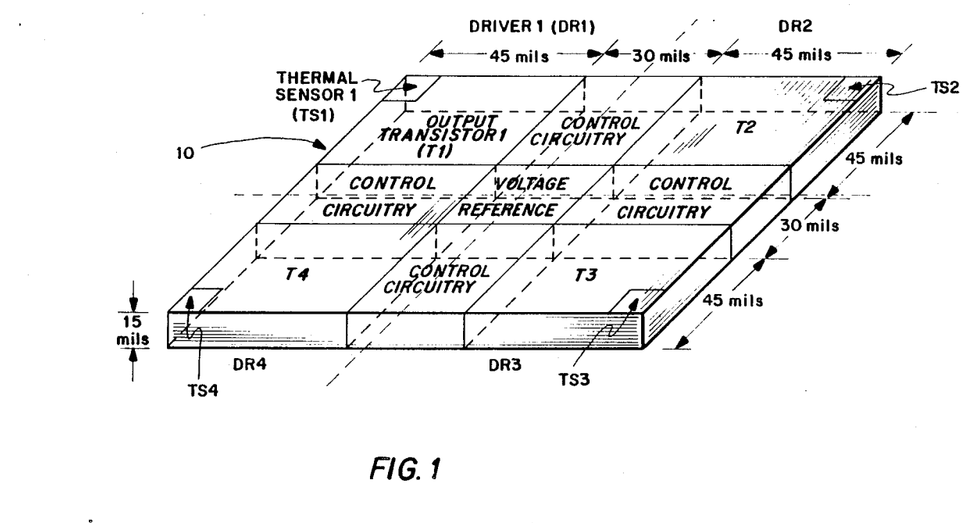
FIG. 1 is a simplified three dimensional representation of a quad-driver integrated circuit (IC) partitioned in accordance with the invention.

FIG. 1 is a simplified layout of a bulk silicon monolithic IC (chip), 10, highlighting the partitioning of chip 10 to form a quad-driver circuit in which the output power transistors are spaced apart from each other as much as reasonably possible. It should be understood that the actual components formed on the chip do not necessarily have the regular shapes shown in FIG. 1, and that FIG. 1 is being used primarily to illustrate an idealized partitioning of chip 10. As shown in FIG. 1, chip 10 is square, with sides of 120 mils, and it is 15 mils thick. Chip 10 is partitioned into four driver circuits (DR1, DR2, DR3 and DR4). Each quad-driver circuit (DRi) includes an output (power) transistor (Ti), control circuitry associated with each output transistor for controlling its conductivity in response to an input signal, and a thermal sensor (TSi). The output transistor (Ti) of each driver (DRi) and its associated thermal sensor TSi are formed in a 45 mil square area located in the corner of the chip in which its driver circuit is formed. In FIG. 1, a thermal sensor (TSi) is located in each extreme corner of the chip, in close proximity to its associated output power transistor. In general, each thermal sensor is preferably formed along the outer periphery of the chip and as close as possible to its associated output power transistor in order to sense and respond, primarily, to the temperature of its associated output power transistor and not to the heat dissipated by the other output power transistors on the chip. Thus, as shown in FIG. 1, each thermal sensor is located so as to be surrounded, as much as possible, by its associated output power transistor. However, where feasible, a thermal sensor may be nested close to the center of the area designated for its output power transistor.

In FIG. 1, each output power transistor (Ti) and its associated thermal sensor (TSi) occupy an area of 45 mils square, leaving a spacing in the horizontal and vertical directions of 30 mils between adjacent output power transistors. The space provided by the 30 mil spacings, or runways, between output transistors and the central core area of the chip are used to form the control circuitry associated with the power transistors, and the reference voltage circuits for operating the thermal sensors and the control circuitry.

As is well known in the art, the various junctions and diffused regions forming the transistors and various other components of the circuit are located, typically, within 1 mil of the top surface of the chip. Therefore, the heat generated on the chip, due to power dissipation within the circuit components, occurs at or near the top surface of the chip.

The chip is mounted on the lead frame of a package which functions as a heat sink providing a thermal resistance ($R_{TJA}$) between the surface (Junctions) of the chip and the ambient of, for example, 60° C./watt. Hence there is a 60° C. rise in temperature, above the ambient, at the surface of the chip per watt dissipated on the chip. The temperature rise at various points on the chip and the thermal conduction through the chip may be better understood with reference to FIG. 2 in which the thermal resistance between various elements is symbolically represented by means of discrete thermal resistors.

Figure 2:
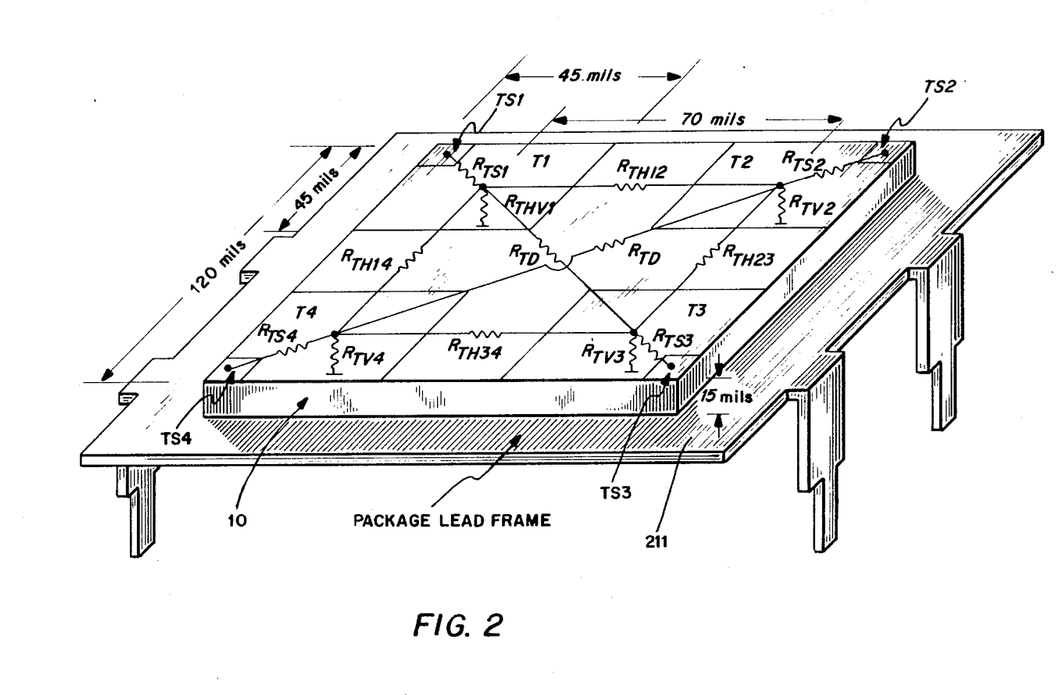
FIG. 2 is a simplified three dimensional representation of the IC of FIG. 1 mounted on the lead frame of a package, including a symbolic representation of the thermal resistance present between various elements.

FIG. 2 is a highly simplified diagram showing various thermal resistances associated with, and between, the output power transistors of chip 10 mounted on the lead frame 211 of a plastic package. FIG. 2 shows that associated with each output power transistor there is: (1) a thermal resistance ($RTV_i$) in the vertical direction between the sruface of the chip and the lead frame; (2) a thermal resistance ($RTH_{ij}$) in the horizontal direction between adjacent (i,j) power transistors. For a square chip, as shown in FIG. 2, the $RTH_{ij}$'s may be assumed equal to each other; (3) a thermal resistance ($R_{TD}$) between output power transistors located at the opposite ends of each diagonal. In the discussion to follow the effect of the thermal resistance along the diagonal will be assumed equal to that along the horizontal, although in practice it has a less pronounced effect; and (4) a thermal resistance $R_{TSi}$ between each power transistor (Ti) and its associated thermal sensor TSi.

For ease of illustration, it is assumed that the power dissipation of each output power transistor occurs at the center of the area allotted for that transistor, although the heat dissipation produced by each output transistor occurs over its whole diffused area.

The effect of the thermal resistance is more easily seen with the aid of the following description of the electrical/thermal operation of the quad-driver circuit.

Figure 3:
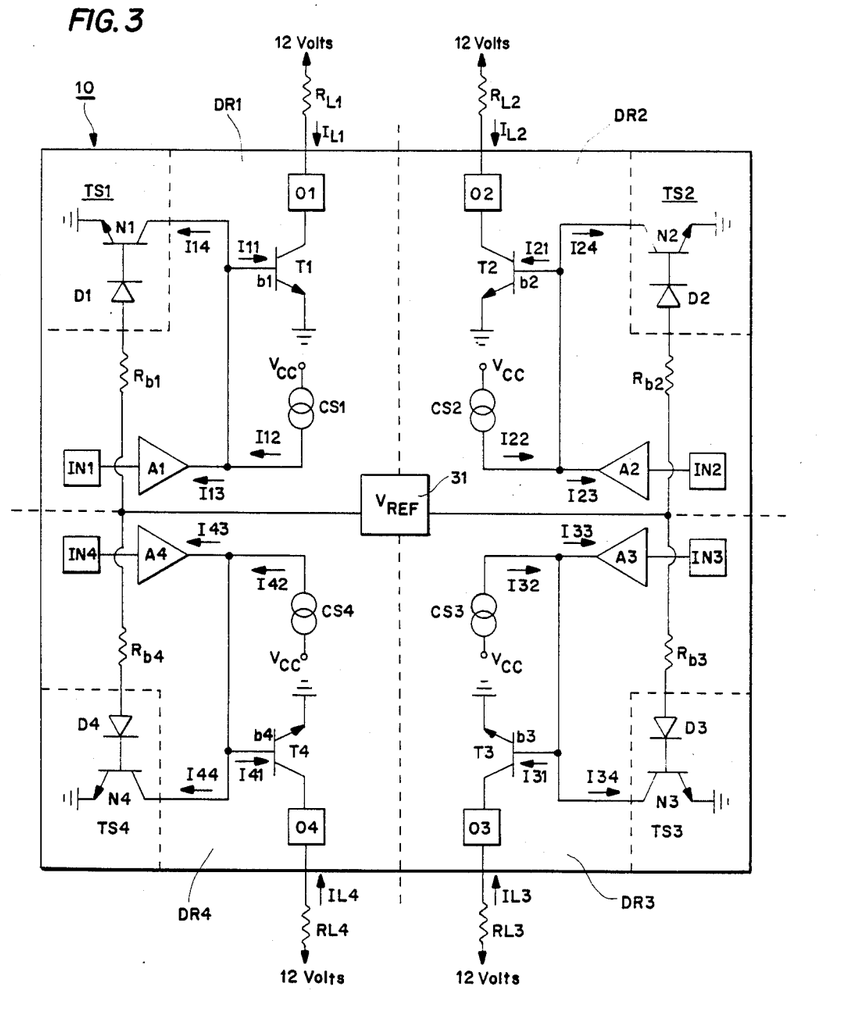
FIG. 3 is a partial schematic, partial block, diagram of parts of a quad-driver formed on a monolithic IC embodying the invention.

The circuit of FIG. 3 shows four driver circuits, DR1, DR2, DR3 and DR4 formed on a monolithic IC 10. Each driver circuit (DRi) includes an output (power) transistor (Ti), a thermal sensor (TSi), and control (Ai) and biasing (CSi) circuitry.

Each output (power) transistor (Ti) is an NPN bipolar device having its emitter grounded and its collector connected to a correspondingly numbered output terminal (Oi). Each output terminal (Oi) is connected via an, off-chip, load impedance (RLi) to a 12 volt dc source, which may be, for example, an automobile battery.

Each thermal sensor (TSi), is thermally coupled as closely as possible to its associated Ti and is electrically coupled to the base of its corresponding power transistor (Ti), for sensing the temperature of Ti and limiting its power dissipation. Each thermal sensor (TSi) includes a forward biased diode D1 and a bipolar transistor, Ni, of N conductivity type. The diode Di is connected at its anode to a reference voltage ($V_{REF}$) and at its cathode to the base of transistor Ni. The collector of Ni is connected to the base of transistor Ti and its emitter is grounded.

Control circuitry (Ai) and a biasing current source (CSi) are connected to the base of a power transistor Ti to control its conductivity in response to an input signal (INi). The input signal INi is applied to the input of Ai which amplifies the input signal and produces an output current Ii3 responsive to the signal INi. The output of Ai and biasing current source, CSi, capable of supplying a current Ii2 of 20 ma, are connected to the base node, bi, of Ti. The output of Ai controls the amount of biasing current flowing into the base of Ti and hence the amplitude of the current (ILi) conducted via the collector-to-emitter path of Ti. By design, when all of Ii2 (the biasing current produced by CSi) flows into the base of Ti, Ti is turned full-ON and typically is driven into saturation.

A source 31 of reference voltage ($V_{REF}$) is formed on the chip and is coupled to each one of the thermal sensors. For purpose of illustration, $V_{REF}$ is assumed equal to 0.7 volt.

Since all the drivers are the same, the operation of only one driver (e.g. DR1) is detailed below. The signal current into the base of T1 is controlled by means of input signal IN1 applied to circuit A1 which sinks a current I13 out of the base node b1. The current source CS1 supplies a current I12 into base node b1. A net signal current I11 equal to I12 minus I13 flows into the base of T1.

The normal operation of the driver circuit is well known and need not be further detailed.

The operation of the driver circuit in response to various temperature imbalances are now discussed.

For ease of the explanation to follow, the following assumptions and characteristics are noted: (1) $V_{REF}$ applied to the anodes of the diodes Di is equal to 0.7 volts; (2) At 25° C. the forward voltage drop ($V_F$) of the diodes D1 is equal to 0.6 volt and the forward $V_{BE}$ drop of the transistors Ni is also equal to 0.6 volt. Thus the sum of $V_F$ of Di plus $V_{BE}$ of Ni is equal to 1.2 volts at 25° C. Consequently, at 25° C. there is no conduction (except for leakage which is negligible and neglected in the discussion to follow) via Di and Ni since $V_{REF}$ is equal to 0.7 volt and it takes at least 1.2 volts to have conduction via Di and Ni; and (3) Each one of the $V_F$ and $V_{BE}$ of Di and Ni, respectively, decreases by $-2$ mV/°C. as their temperature increases. Consequently, when the temperature of a thermal sensor reaches 150° C. [i.e., 125° C. above the assumed ambient of 25° C.] the sum of $V_F$ and $V_{BE}$ of Di and Ni equals 0.7 volt. Hence when the temperature around a thermal sensor reaches, and exceeds, 150° C., its transistor Ni is turned-on and conducts. The effect of the conduction of Ni is detailed below.

In the discussion to follow assume that: (a) each output transistor (Ti) has a forward current gain ($\beta$) of 50; (b) each Ni transistor has a $\beta$ of 100; (c) each current source (CSi) supplies a current of 20 milliamperes into the base node of Ti; and (d) each RLi has an equivalent impedance of 22 ohms.

Under normal operating conditions, assuming each Ti to be operating correctly and each Ti to be turned-on with close to 20 ma flowing into its base, each Ti is driven into saturation. A detailed explanation follows using Ti as an example and assuming each Ti to have $V_{CESAT}$ of 0.25 volt.

With 20 ma into its base, T1 can conduct a collector current of up to 1 ampere. However, the actual load current is equal to 0.534 amperes as calculated below.

$$I_{LOAD} = \frac{12 \text{ v} - 0.25 \text{ v}}{22 \text{ ohms}} = 0.534 \text{ amperes} \quad \text{eq. 1}$$

Hence, T1 is in saturation.

The power dissipation within power transistor T1 may then be calculated to be as follows:

$$(0.25 \text{ v}) (0.534 \text{ A}) = 0.134 \text{ watts}$$

Assuming the four power transistors on the chip to be turned-on, the total on-chip power dissipation (neglecting the dissipation in the control and voltage refernece circuitry) is equal to a total of 0.536 watt (i.e. 4×0.134 watts).

Assuming, as above, that the thermal resistance between the junction (i.e. surface of the chip) and the ambient to be 60° C./watt, the surface temperature of the chip will be approximately 57° C. with 0.536 watts being dissipated on-chip.

Assume now that the load RL2 connected to T2 is shorted. With RL2 shorted, the current through T2 increases to 1 ampere (20 ma times a $\beta$ of 50). With 12 volts applied across its collector-to-emitter, the instantaneous peak power dissipation across T2 is 12 watts.

With such a large power dissipation in a small section of the chip (i.e. the area where T2 is located) the temperature in the area of T2 rises very quickly. However, as the temperature in the area of T2 rises towards 150° C. and tends to exceed 150° C., thermal sensor TS2, in close proximity to T2, senses the rise in temperature and since its thermal time constant is relatively short, it responds very quickly. TS2, because of its tight thermal coupling to T2, senses the rise in temperature of T2 and responds to it before the rise is sensed by the other thermal sensors on the chip. Thus, as the temperature at, and around, T2 reaches 150° C. and tends to exceed it, a base current flows via resistor Rb2 and diode D2 into the base of N2. This base current is multiplied by the beta of N2 which then draws a current I24 out of the base of T2 decreasing the base current I21 into T2 and thereby the collector current through T2, whereby the power dissipation of T2 is prevented from increasing above a certain level.

By way of example, for a particular design, when the temperature at T2 exceeds 150° C. (e.g. 152° C.) the current through N2 is equal to 17.5 ma and the current into the base of T2 is decreased to 2.5 ma. The collector (i.e. load) current through T2 is then reduced to 125 ma resulting in a power dissipation of 1.5 watts across T2.

With the power dissipation in, an around, T2 limited to 1.5 watts it can be shown that the temperature at T1, T3 and T4 rises to less than 150° C. Furthermore, so long as the temperature at T1, T3 and T4 is limited to less than 150° C., their thermal sensors remain unaffected by the increased dissipation of T2 and the thermal sensors of T1, T3 and T4 do not have a significant adverse effect on the conductivity of their respective power transistors.

Thus, each output power transistor on the chip can be independently and separately controlled, or shut down, without shutting down the other output power transistors on the chip.

It can be shown that when, for example, T2 is at 150° C., the other output power transistors, if functioning normally (i.e. each dissipating approximately 0.134 watts), are at temperatures sufficiently below 150° C., whereby their thermal sensors do not have a significant effect on their conductivity. The thermal calculations below are very approximate being intended only to give an indication of the thermal response and conditions.

With T2 dissipating 1.5 watts and being at, or slightly above, 150° C. and with each one of T1, T3 and T4 dissipating 0.134 watts, the power dissipation (P.D.) on the chip is approximately 1.902 watts.

The thermal resistance between the chip surface and the ambient may be broken down into two series components;

(a) one component, $R_{TJF}$ is the thermal resistance between the chip surface (i.e. the junctions) and the lead frame; and (b) the other component ($R_{TFA}$) is the thermal resistance between the lead frame and the ambient. It is assumed that $R_{TJF}$ is equal to 12° C./watt, while $R_{TFA}$ is equal to 48° C./watt.

With 1.902 watts dissipated on the chip surface and its temperature at, or close to, 150° C., and with 12° C./watt between the chip surface and the lead frame, the temperature, $T_F$, of the lead frame may be calculated to be:

$$T_F = T \text{ of chip surface} - (P.D.)(R_{TJF}) = 150° \text{C.} - (1.902 W)(12° \text{C.}/W)$$

$$T_F = 127.2° \text{C.}$$

With T2 at 150° C. and with the lead frame at 127.2° C., the temperature rise at other points of the chip, such as at TS1, TS3 and TS4, may be explained with reference to FIG. 4.

Figure 4:
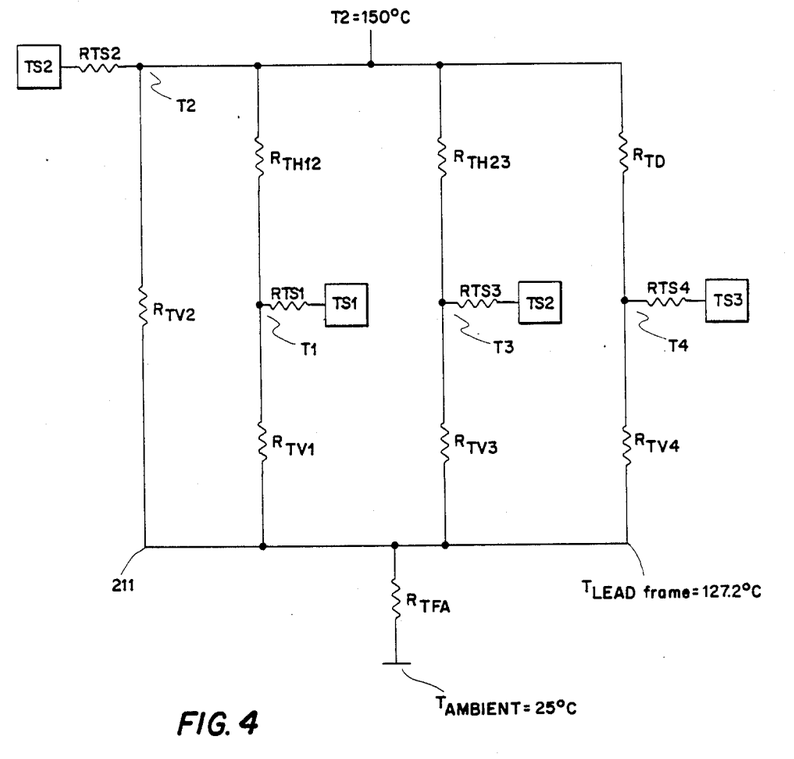
FIG. 4 is a simplified thermal diagram illustrating the temperature distribution at certain points of the chip due to one power transistor.

The diagram of FIG. 4 assumes that T2 is at 150° C. and the lead frame is at 127.2° C. Heat is conducted from T2 via the horizontal thermal paths of $R_{TH12}$, $R_{TH23}$, and $R_{TD}$ to the other output power transistors T1, T3 and T4, respectively. The heat is also conducted from T2 and from the various power transistors Ti to their respective thermal sensors TSi via the thermal sensing resistances RTSi (which may be neglected because of the tight thermal coupling between the Ti's and their TSi's) and via the vertical thermal resistances $R_{TVi}$ to the lead frame. Assuming the horizontal thermal resistances $R_{THij}$ and $R_{TD}$ to be approximately 39° C./W and the vertical thermal resistances to be approximately 7.4° C./W, the temperature at T1 and TS1, T3 and TS3, T4 and TS4, is approximately equal to 129° C. when T2 is at 150° C., with T2 dissipating 1.5 watts and T1, T3 and T4 each dissipating 0.134 watts.

With TS1, TS3 and TS4 at 129° C., it can be shown that there is no conduction via N1, N3 and N4 in their associated thermal sensors TS1, TS3 and TS4.

At 129° C., the sum of $V_F$ and $V_{BE}$ of the respective Di and Ni in TSi is equal to 0.784 millivolts. Since $V_{REF}$ is equal to 0.7 volt and since at least 0.784 volt is needed to turn on N1, N3 or N4, it is evident that they do not conduct and have no significant effect on their corresponding power transistors.

Hence, each output power transistor can be independently controlled so long as a temperature gradient or differential exists between the output transistors when their power dissipation is different. These results are achieved by one or more of the following features of the invention. By spacing the output power transistors (Ti) as far apart as possible, a temperature differential between the output power transistors will be produced when their dissipation is different. By locating or nesting each thermal sensor as close as possible or within the area of its associated output power transistor, each thermal sensor can quickly sense the temperature of its associated output power transistor. Furthermore, by locating each thermal sensor between its associated output transistor and the periphery of the chip, such that each thermal sensor is as far away as possible from the other output transistors and thermal sensors on the chip, each thermal sensor responds primarily to the heat dissipation and temperature rise associated with its output power transistor. Then, its response to the heat dissipation and temperature rise of the other output power transistors on the chip does not significantly affect the conductivity of its associated power transistor. Applicant found that spacing the thermal sensor associated with an output power trnsistor away from any other output power transistor on the chip a distance of at least 3 times the thickness of the chip produced generally acceptable results.

Figure 5:
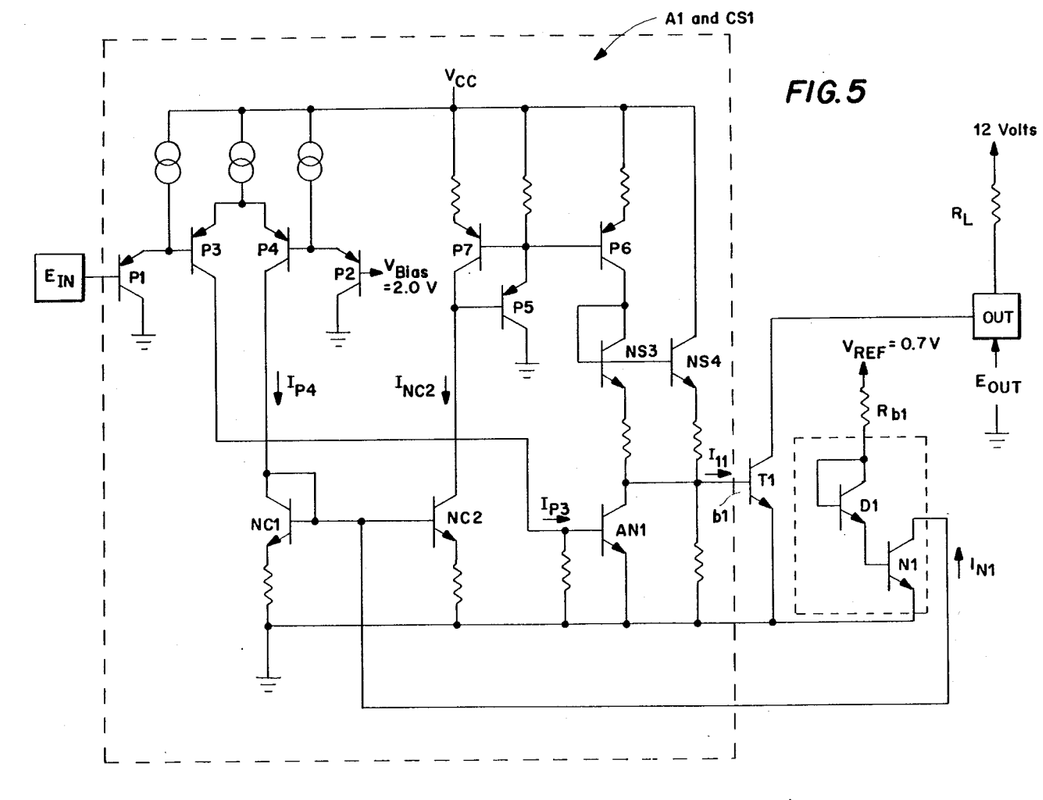
FIG. 5 is a detailed schematic diagram of a quadgated power driver embodying the invention.

Control and current sourcing circuitry for producing the functions of Ai and CSi and a thermal sensor for producing the function of TSi may be of the type shown schematically in FIG. 5. Note that in FIG. 5, diode D1 in TS1 is formed by connecting the base of a transistor to its collector and by using the emitter of the transistor as a cathode. A current limiting resistor, Rb1, functioning to limit or control the level of base current into N1, is connected between $V_{REF}$ and the collector/base of D1. The emitter of D1 is connected to the base of N1 whose collector is connected to the bases of current mirror transistors NC1 and NC2 (rather than T1 as shown in FIG. 3) and whose emitter is grounded. The circuit of FIG. 5 will be examined for the "normal" condition when the temperature of the output transistor, T1, (and its associated circuitry) is below the level at which the thermal sensor TSi conducts, and then for the "high temperature" condition when the temperature of the output transistor and its associated circuitry exceeds a prescribed level and TSi conducts.

For the "normal" condition assumed to be below 150° C., D1 and N1 do not conduct and the current $I_{N1}$ through N1 is zero. For the "normal" condition, it can be shown that when the input signal ($E_{IN}$) is high, that the output signal ($E_{OUT}$), produced at the collector of transistor T1, is low and that when $E_{IN}$ is low, $E_{OUT}$ is high. That is, under "normal" conditions, the combination of A1, CS1 and T1 functions as an inverter. The operation of A1, CS1 and T1 under "normal" conditions is briefly as follows:

When $E_{IN}$ goes high, (e.g. greater than $V_{BIAS}$) P1 and P3 are turned-off. P2 and P4 are then turned-on and the collector current IP4 of P4 flows into the collector and base of NC1 and into the base of NC2. The collector-to-emitter current of NC1 is mirrored by NC2, whose collector current (INC2) drawn out of the base of transistor P5 turns-it-on causing transistors P6 and P7 to conduct and to be turned-on. The collector current of P6 causes current to flow via transistors NS3 and NS4 into the base of transistor T1, turning-it-on and causing T1 to drive the off-chip load RL. Since P3 is turned-off, there is no current flowing into the base of AN1 and AN1 draws no current. Substantially, all the current sourced by NS3 and NS4 is then fed into the base of T1. Where RL is 22 ohms and the current into the base of T1 is 20 ma and T1 has a $\beta$ of 50, T1 is in saturation and the voltage at the output terminal is at, or close to, 0.25 volts.

When $E_{IN}$ is low, P1 and P3 are turned-on and cause the turn-off of P2 and P4. The turn-on of P3 causes a current to flow into the base of AN1. AN1 then draws its collector-to-emitter current out of the base of T1 causing T1 to be turned-off. The voltage at the output terminal (OUT) can then go high (i.e. to 12 volts).

The operation of the circuit under high temperature condition is now examined.

When the temperature of T1 and TS1 exceeds 150° C., current flows from $V_{REF}$ via Rb1 and diode D1 into the base of transistor N1. This current is multiplied by the beta of N1 which then draws its collector current out of the bases of NC1 and NC2 to ground. Since the base currents of NC1 and NC2 tend to be small, N1 can control and ensure the turn-off of NC1 and NC2 at low current levels. This, as demonstrated below, functions to effectively control the conductivity of T1 when its power dissipation exceeds the prescribed level.

When $E_{IN}$ is low, essentially no current is supplied into the base of T1 (it is off), and TS1 does not affect the circuit operation.

When $E_{IN}$ is "high" a current, IP4, flows tending to cause a current, INC2, to flow, which in turn causes P5 and P6 to conduct which in turn causes NS3 and NS4 to conduct causing a current I11 to flow into the base of T1. However, as the temperature reaches and exceeds 150° C., a current flows from $V_{REF}$ via Rb1 and D1 into the base of N1 whose collector current is drawn from the current IP4. The collector-to-emitter current of N1 may draw all the current being supplied by IP4 and functions to control the conductivity of T1 through a full range of operation (i.e. from full-OFF to full-ON).

The advantage of controlling the current at the bases of NC1 and NC2 as shown in FIG. 5 rather than controlling the current at the base of T1 as shown in FIG. 3 is that the control can be achieved at lower current levels. However, it should be evident that the thermal sensor control can be applied to other appropriate points of the circuit without departing from the invention.

What is claimed is:

1. In a monolithic integrated circuit (IC) in which "N" driver power circuits are formed; where "N" is an integer greater than 2; with each one of said driver power circuits including at least one output power transistor having a main conduction path and a base for controlling the conductivity within the main conduction path, the improvement comprising:

said integrated circuit being partitioned into different sections, one section for each driver power circuit, the output power transistors of each driver power circuit being formed in said IC separate and apart from those of any other driver power circuit for producing sufficient thermal resistance between the output power transistors of the different driver power circuits to ensure the generation of a temperature differential between the power transistors of the different driver sections when their power dissipation is different; and a separate thermal sensor per each driver power circuit, each thermal sensor being formed in close proximity to its associated output power transistor and being thermally coupled very tightly to its associated power transistor so as to primarily respond to the temperature variation of its associated power transistor, and each thermal sensor being electrically coupled to the base of its associated power transistor for controlling the conductivity of its associated power transistor when the power dissipation of its associated power transistor exceeds a predetermined level.

2. In the monolithic IC as claimed in claim 1 wherein the thermal resistance between the thermal sensor and its associated output power transistor is much lower than the thermal resistance between that thermal sensor and any of the other output transistors in the different sections of the integrated circuit.

3. In the monolithic IC as claimed in claim 1 wherein each thermal sensor provides linear and continuous control of the conductivity of its associated power transistor in order to control the temperature of its associated power transistor.

4. In the monolithic IC as claimed in claim 1 wherein each thermal sensor provides continuous and linear control of its associated power transistor so that each driver power circuit is operated independently and responds independently of any other.

5. A monolithic integrated circuit (IC) chip comprising:

a plurality of output power transistors formed on said monolithic IC spaced apart from each other, each one of said power transistors having a main conduction path for driving an off-chip load and having a control terminal for controlling the conductivity of its main conduction path;

a control circuit means for each one of said plurality of output power transistors, each control circuit means including means responsive to an input signal and including means for applying its output signal to the control terminal of its corresponding output power transistor; and a thermal sensor per each one of said plurality of output power transistors, each one of said thermal sensors being formed in close physical proximity to its associated output power transistor for thermally tightly coupling the themal sensor to its associated output power transistor the thermal resistance between a thermal sensor and its associated output power transistor being less than the thermal resistance between that sensor and any other output power transistor formed on said IC so that each thermal sensor responds primarily to the temperature variation of its associated power transistor, each thermal sensor being coupled to the control terminal of its associated output power transistor for controlling its conductivity when the power dissipation and temperature of its associated power transistor exceeds a predetermined level.

6. In a monolithic integrated circuit chip having a length, L, a width, W, and a thickness, T, in which "N" driver power circuits are formed, where N is an integer greater than 3, with each one of said driver power circuits including at least one output power transistor, each power transistor having a main conduction path and a base for controlling the conductivity of its main conduction path for driving an off-chip load; the improvement comprising:

said integrated circuit being partitioned into "N" different sections, one section for each driver circuit, the power transistors of each driver power circuit, formed on said IC, being spaced apart a sufficient distance from those of any other driver power circuit for generating a temperature differential between the power transistors of the different driver sections when their power dissipation is different; and a separate thermal sensing means per said at least one output power transistor, of each driver circuit, each thermal sensing means being formed in close proximity to its associated output power transistor and at the outer periphery of said chip most distant from the power transistors of other driver circuits, each thermal sensing means being thermally tightly coupled to its associated power transistor, so that eah thermal sensor responds primarily to the temperature variation of its associated power transistor, and each thermal sensor being electrically coupled to the base of its associated power transistor for controlling the conductivity of its associated power transistor when the power dissipation of its associated power transistor exceeds a predetermined level.

7. In a monolithic integrated circuit (IC) in which N driver power circuits are formed, where N is an integer equal to, or greater than 2, with each one of said N driver power circuits including at least one output power transistor having a main conduction path and a base for controlling the conductivity within its main conduction path, the improvement comprising:

said integrated circuit being partitioned into different sections, one section for each one of said N driver power circuits, the output power transistors of each driver power circuit being formed in said IC separate and apart from those of any other driver circuit, said N output power transistors being spaced sufficiently apart to produce sufficient thermal resistance to ensure the generation of a temperature differential between the power transistors of the different sections when their power dissipation is different; and a separate thermal sensor per each driver power circuit, each thermal sensor being formed in close proximity to its associated output power transistor and the thermal resistance between each thermal sensor and its associated output power transistor being less than the thermal resistance between that thermal sensor and any other output power transistor formed on said IC whereby the thermal sensor senses primarily the temperature of its associated output power transistor, and each thermal sensor being electrically coupled to the base of its associated power transistor for controlling the conductivity of its associated power transistor when the power dissipation of its associated power transistor exceeds a predetermined level.

* * * * *